(12) United States Patent
Okada et al.

(10) Patent No.: US 11,837,569 B2
(45) Date of Patent: Dec. 5, 2023

(54) SEMICONDUCTOR DEVICE AND MANUFACTURING METHOD THEREOF

(71) Applicant: Kioxia Corporation, Tokyo (JP)

(72) Inventors: Yoshiharu Okada, Yokkaichi (JP); Masatoshi Kawato, Kameyama (JP); Keiichi Niwa, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 30 days.

(21) Appl. No.: 17/178,434

(22) Filed: Feb. 18, 2021

(65) Prior Publication Data

US 2022/0059493 A1 Feb. 24, 2022

(30) Foreign Application Priority Data

Aug. 19, 2020 (JP) .................................. 2020-138900

(51) Int. Cl.
*H01L 23/00* (2006.01)
*H01L 23/31* (2006.01)
(Continued)

(52) U.S. Cl.
CPC .......... *H01L 24/32* (2013.01); *H01L 23/3135* (2013.01); *H01L 24/33* (2013.01); *H01L 24/83* (2013.01); *H01L 25/18* (2013.01); *H01L 25/50* (2013.01); *H01L 23/5384* (2013.01); *H01L 24/16* (2013.01); *H01L 24/48* (2013.01); *H01L 24/73* (2013.01); *H01L 24/92* (2013.01); *H01L 2224/16227* (2013.01); *H01L 2224/3207* (2013.01); *H01L 2224/32145* (2013.01); *H01L 2224/32238* (2013.01); *H01L 2224/3303* (2013.01); *H01L 2224/33181* (2013.01); *H01L 2224/48105* (2013.01);
(Continued)

(58) Field of Classification Search
None
See application file for complete search history.

(56) References Cited

U.S. PATENT DOCUMENTS 6,958,259 B2 * 10/2005 Shibue .................... H01L 24/32
257/E23.126
8,803,304 B2   8/2014 Igarashi et al.
(Continued)

FOREIGN PATENT DOCUMENTS

JP        2002184936 A  *  6/2002
JP        2012-15142 A       1/2012
(Continued)

*Primary Examiner* — Telly D Green
(74) *Attorney, Agent, or Firm* — Oblon, McClelland, Maier & Neustadt, L.L.P.

(57) ABSTRACT

A semiconductor device according to the present embodiment includes a circuit board comprising a plurality of electrodes provided on a first surface, a first resin layer provided on the first surface around the electrodes, and a second resin layer provided on the first resin layer. A first semiconductor chip is connected to a first one of the electrodes. A second semiconductor chip is provided above the first semiconductor chip, being larger than the first semiconductor chip, and is connected to a second one of the electrodes via a metal wire. A third resin layer is provided between the first semiconductor chip and the second semiconductor chip and between the second resin layer and the second semiconductor chip, and covers the first semiconductor chip.

20 Claims, 14 Drawing Sheets

(51) Int. Cl.
H01L 25/18 (2023.01)
H01L 25/00 (2006.01)
H01L 23/538 (2006.01)

(52) U.S. Cl.
CPC .............. *H01L 2224/48145* (2013.01); *H01L 2224/48228* (2013.01); *H01L 2224/73204* (2013.01); *H01L 2224/73215* (2013.01); *H01L 2224/73253* (2013.01); *H01L 2224/73265* (2013.01); *H01L 2224/83192* (2013.01); *H01L 2224/83193* (2013.01); *H01L 2224/92247* (2013.01)

(56) References Cited

U.S. PATENT DOCUMENTS

| | | | |
|---|---|---|---|
| 9,252,126 B2 * | 2/2016 | Tomohiro | H01L 25/0657 |
| 2005/0017340 A1 * | 1/2005 | Shibue | H01L 23/3135 |
| | | | 438/109 |
| 2005/0156323 A1 * | 7/2005 | Tokunaga | H01L 25/0657 |
| | | | 257/E21.511 |
| 2010/0090327 A1 * | 4/2010 | Ogata | H01L 24/32 |
| | | | 257/E23.116 |
| 2010/0102424 A1 * | 4/2010 | Onodera | H01L 25/0657 |
| | | | 257/679 |
| 2011/0309494 A1 * | 12/2011 | Onodera | H01L 21/56 |
| | | | 257/737 |
| 2011/0312108 A1 * | 12/2011 | Onodera | H01L 25/0657 |
| | | | 257/E21.531 |
| 2011/0316172 A1 * | 12/2011 | Igarashi | H01L 23/3121 |
| | | | 257/777 |
| 2013/0137217 A1 * | 5/2013 | Kindo | H01L 21/50 |
| | | | 438/109 |
| 2013/0256918 A1 * | 10/2013 | Tomohiro | H01L 24/97 |
| | | | 257/777 |
| 2015/0255446 A1 * | 9/2015 | Onodera | G06F 1/183 |
| | | | 438/107 |
| 2016/0064358 A1 * | 3/2016 | Usami | H01L 24/32 |
| | | | 257/737 |
| 2017/0069614 A1 * | 3/2017 | Onodera | H01L 23/3135 |
| 2018/0261574 A1 * | 9/2018 | Karakane | H01L 24/73 |
| 2019/0206837 A1 * | 7/2019 | Kurita | G11C 5/04 |
| 2020/0020669 A1 * | 1/2020 | Uchida | H01L 27/11568 |
| 2021/0020609 A1 | 1/2021 | Takaku | |
| 2022/0059493 A1 * | 2/2022 | Okada | H01L 24/83 |

FOREIGN PATENT DOCUMENTS

| | | |
|---|---|---|
| JP | 2012-156389 A | 8/2012 |
| JP | 2014-36183 A | 2/2014 |
| JP | 2021-15922 A | 2/2021 |
| WO | WO-2014103855 A1 * | 7/2014 ............. H01L 23/16 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2020-138900, filed on Aug. 19, 2020, the entire contents of which are incorporated herein by reference.

FIELD

The embodiments of the present invention relate to a semiconductor device and manufacturing method thereof.

BACKGROUND

A SiP (System in Package) having a plurality of semiconductor chips stacked on a circuit board and packaged has been developed. In stacking of semiconductor chips, one semiconductor chip is bonded onto another semiconductor chip on a lower tier via a DAF (Die Attachment Film). In this bonding, the DAF is melted to be embedded between the lower semiconductor chip and the upper semiconductor chip.

However, there is a case where the melted DAF bleeds or regresses from an end of a semiconductor chip. Bleeding of the DAF may cause poor connection of wire bonding in a pad adjacent to the semiconductor chip. Further, bleeding or regressing of the DAF causes the upper semiconductor chip to be tilted, warped, or cracked, and this leads to decrease of reliability.

DETAILED DESCRIPTION

Figure 1:
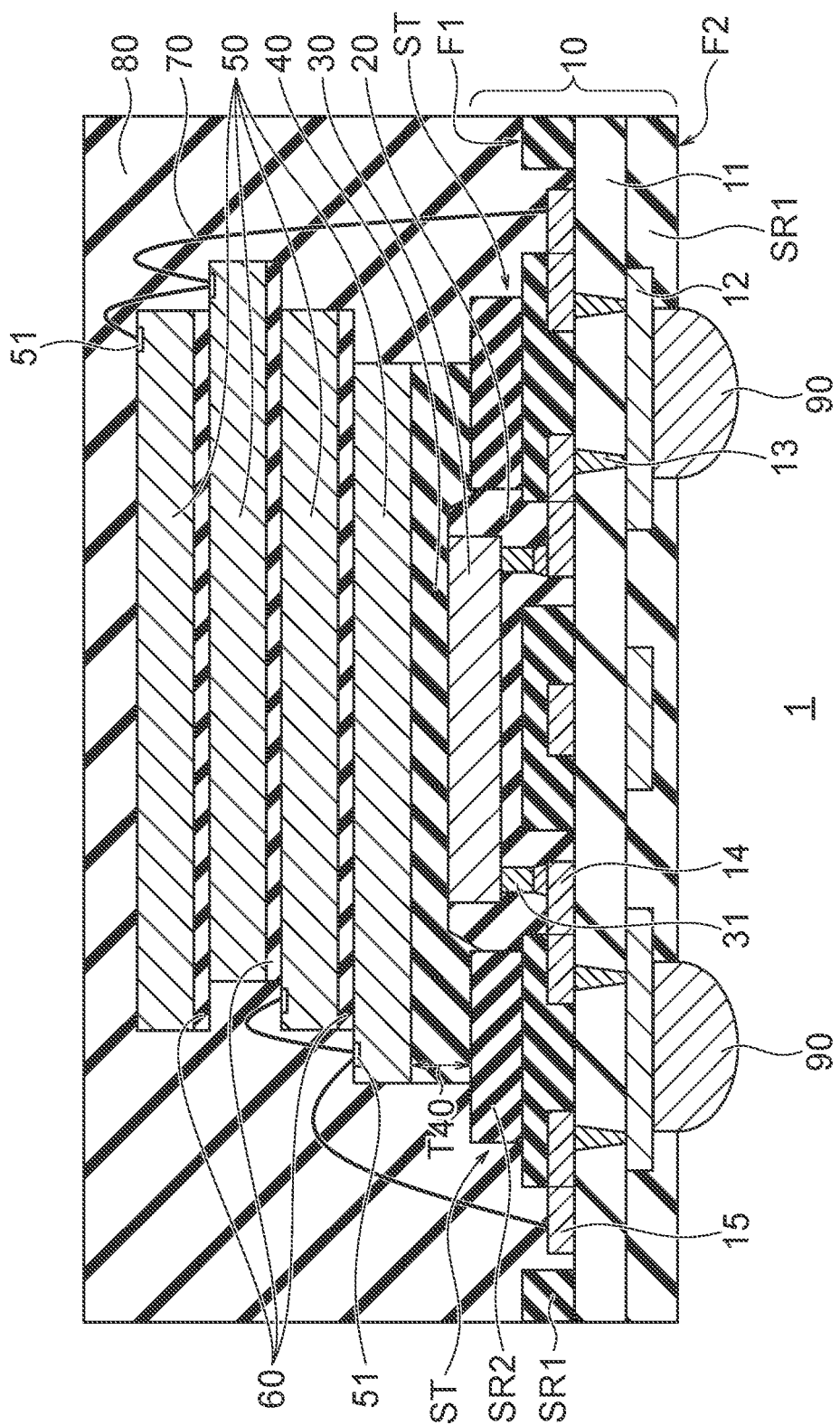
FIG. 1 is a cross-sectional view illustrating a configuration example of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a wiring substrate on which semiconductor chips are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment comprises a circuit board comprising a plurality of electrodes provided on a first surface, a first resin layer provided on the first surface around the electrodes, and a second resin layer provided on the first resin layer. A first semiconductor chip is connected to a first one of the electrodes. A second semiconductor chip is provided above the first semiconductor chip, being larger than the first semiconductor chip, and is connected to a second one of the electrodes via a metal wire. A third resin layer is provided between the first semiconductor chip and the second semiconductor chip and between the second resin layer and the second semiconductor chip, and covers the first semiconductor chip.

First Embodiment

FIG. 1 is a cross-sectional view illustrating a configuration example of a semiconductor device 1 according to a first embodiment. The semiconductor device 1 according to the present embodiment is a NAND flash memory, for example. The semiconductor device 1 includes a circuit board 10, a resin layer (NCP (Non-Conductive Paste)) 20, a controller chip 30, a resin layer (DAF (Die Attach Film)) 40, a NAND memory chip (hereinafter, memory chip) 50, an adhesive layer 60, a metal wire 70, a sealing resin 80, and a metal bump 90. The application of the present embodiment is not limited to a NAND flash memory, and can be applied to general semiconductor packages including a plurality of stacked semiconductor chips.

The circuit board 10 includes an insulating substrate 11, a wire 12, a via 13, electrodes 14 and 15, and solder resists SR1 and SR2. An insulating material such as glass epoxy resin is used for the insulating substrate 11. The wire 12 is provided on a surface or a back of the insulating substrate 11 or in the insulating substrate 11, and is electrically connected to the electrodes 14 and 15. The via 13 is provided to penetrate through the insulating substrate 11 and electrically connects wires 12 to each other.

The electrodes 14 and 15 are provided on a surface F1 of the circuit board 10. The electrode 14 as a first electrode is connected to a metal bump 31 of the controller chip 30 on the surface F1 of the circuit board 10. The electrode 15 as a second electrode is connected to a pad 51 of the memory chip 50 via the metal wire 70 on the surface F1 of the circuit board 10. Low-resistance metal such as copper is used for the wire 12 and the electrodes 14 and 15. Although not illustrated, a metal bump may be provided on a back F2 of the circuit board 10 by using nickel, solder, or the like. The metal bump is electrically connected to the electrode 14 and/or the electrode 15 via the wire 12. The wire 12 and the insulating substrate 11 may have a multilayer wiring structure including three or more layers.

The solder resist SR1 as a first resin layer is provided around the electrodes 14 and 15 on the surface F1 of the circuit board 10. The solder resist SR1 may be provided on the entirety of the surface F1 and the back F2 other than the electrodes 14 and 15. The solder resist SR1 may partially cover the electrodes 14 and 15, but is not provided in a connection region of the metal bump 31 or the metal wire 70, so that the connection region of the metal bump 31 or the metal wire 70 is exposed. Further, the solder resist SR1 allows a portion of the wire 12 serving as a connection region to be exposed on the back F2. The metal bump 90 is provided on this exposed connection region of the wire 12. In the present embodiment, the solder resist SR1 is merely an example of the first resin layer, and the first resin layer is not limited thereto.

The solder resist SR2 as a second resin layer is provided on the solder resist SR1 around the controller chip 30 so as to surround the controller chip 30 in plan view as viewed from above the surface F1 of the circuit board 10. The solder resist SR2 is provided inside the solder resist SR1 in the plan view described above, and the solder resists SR1 and SR2 are stacked in two layers. Therefore, a step ST between the solder resists SR1 and SR2 is formed at an end of the solder resist SR2. The solder resists SR1 and SR2 may be made of the same material as each other or different materials from each other. Although the height of the solder resist SR2 may be lower than the top surface of the controller chip 30, it may be at the same level as or higher than the top surface of the controller chip 30. Although the solder resists SR1 and SR2 in two layers are provided in the present embodiment, solder resists in three or more layers may be provided. Further, in the present embodiment, the solder resist SR2 is merely an example of the second resin layer, and the second resin layer is not limited thereto.

The controller chip 30 as a first semiconductor chip is provided with the metal bump 31 on its surface opposed to the circuit board 10. The metal bump 31 is connected to the electrode 14 of the circuit board 10. The controller chip 30 is connected in flip-chip connection on the circuit board 10. A substrate (not illustrated) of the controller chip 30 is formed to be thin. The controller chip 30 has a semiconductor element (not illustrated) on its surface on which the metal bump 31 is provided. The semiconductor element is electrically connected to the wire 12 on the circuit board 10 via the metal bump 31.

The resin layer (NCP) 20 is filled between the circuit board 10 and the controller chip 30, and covers and protects a portion of connection between the electrode 14 and the metal bump 31. The resin layer 20 is also filled between the controller chip 30 and the solder resists SR1 and SR2 and the resin layer 40, thereby protecting the controller chip 30. The resin layer 20 is in contact with an inner wall surface of each of the solder resists SR1 and SR2. Further, the resin layer 20 may reach the top surface of the solder resist SR2. The resin layer 20 is made of a non-conductive resin material (NCP) and may be, for example, a paste in which epoxy resin, acrylic resin, silica, and the like are mixed with each other.

The resin layer 40 is provided between the controller chip 30 and the memory chip 50 and between the solder resist SR2 and the memory chip 50, thereby covering the controller chip 30. An insulating resin such as a die attach film is used for the resin layer 40.

In a case where the thickness of the solder resist SR2 is increased in such a manner that the top surface of the solder resist SR2 is made higher, the height of the top surface of the solder resist SR2 may be at the same level as or higher than the top surface of the controller chip 30.

The memory chip 50 as a second semiconductor chip is provided above the controller chip 30. The memory chip 50 is bonded onto the controller chip 30 and the solder resist SR2 with the resin layer (the adhesive layer) 40. The memory chip 50 has, for example, a three-dimensional memory cell array that includes a plurality of memory cells arranged three-dimensionally, on its surface. The resin layer 40 is pasted onto the back of the memory chip 50 in advance, and the memory chip 50 is pressed against the circuit board 10 and is heated in a die attachment process. Accordingly, the resin layer 40 buries the controller chip 30 and the resin layer 20, and the memory chip 50 is bonded onto the controller chip 30. The memory chip 50 is larger than the controller chip 30 in plan view as viewed from above the surface F1. Therefore, the resin layer 40 pasted to the back of the memory chip 50 is also larger than the controller chip 30 and can cover the entire surface of the controller chip 30 in the die attachment process.

A plurality of the memory chips 50 may be stacked on the controller chip 30. Although the number of the stacked memory chips 50 is four in FIG. 1, it is not specifically limited. The adhesive layer 60 is pasted onto the back of each memory chip 50 in advance. The memory chip 50 is stacked on the underlying memory chip 50 and both are bonded to each other with the adhesive layer 60.

The metal wire 70 electrically connects the pad 51 of the memory chip 50 and any of the electrodes 15 on the circuit board 10. Accordingly, the semiconductor element of the memory chip 50 is connected to the wire 12 on the circuit board 10 via the metal wire 70. The sealing resin 80 covers and protects the whole structure on the circuit board 10 including the controller chip 30, the memory chip 50, the metal wire 70, and the like.

The metal bump 90 is electrically connected to a portion of the wire 12 on the back F2. Low-resistance metal such as solder is used for the metal bump 90.

Figure 2:
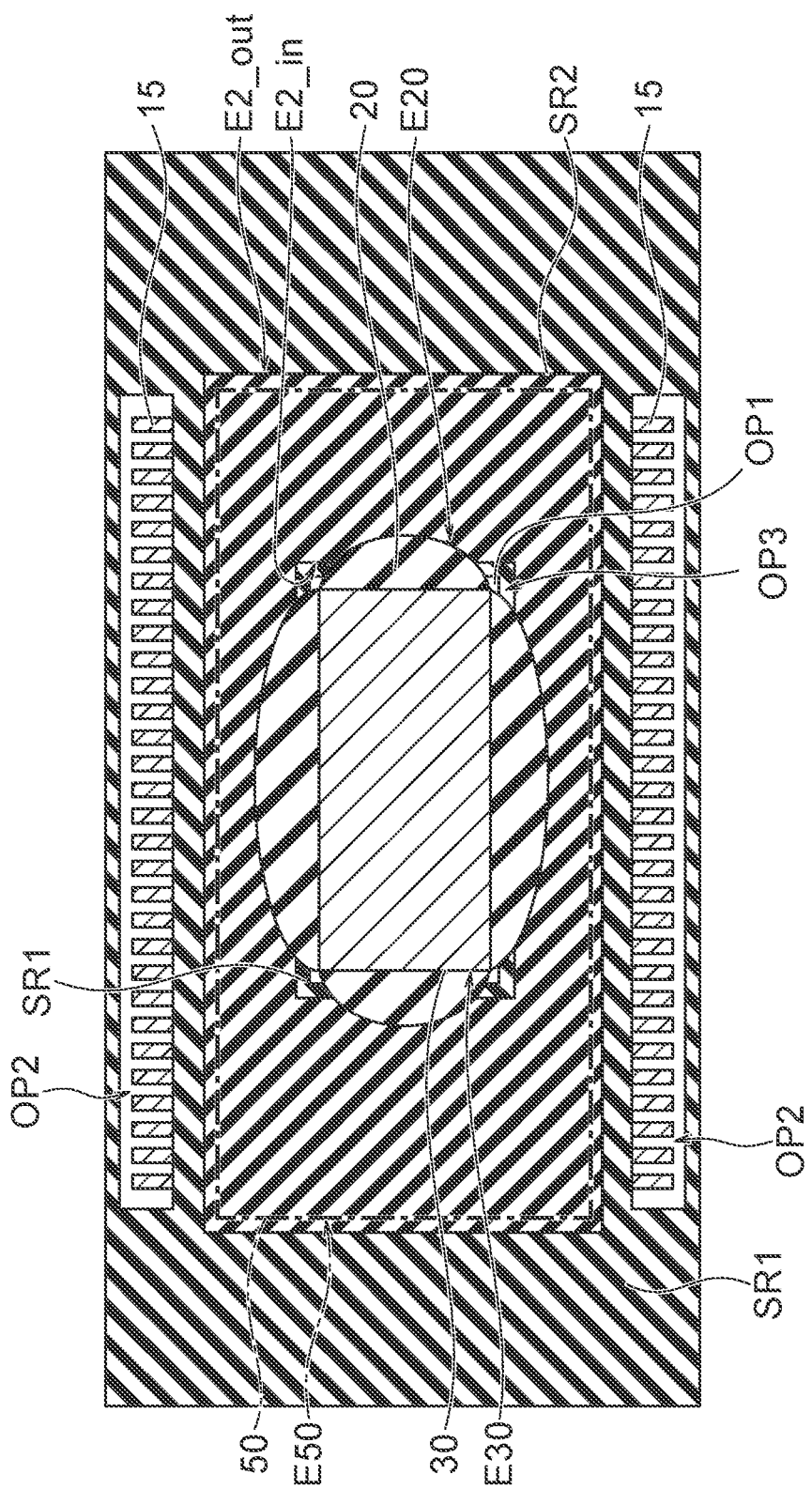
FIG. 2 is a schematic plan view illustrating a configuration example of the semiconductor device according to the first embodiment.

FIG. 2 is a schematic plan view illustrating a configuration example of the semiconductor device 1 according to the first embodiment. FIG. 2 illustrates the planar layout of the solder resists SR1 and SR2, the controller chip 30, the memory chip 50, and the like as viewed from above the surface F1 of the circuit board 10.

The solder resist SR1 substantially covers the entirety of the surface F1 of the circuit board 10 other than the electrodes (pads) 14 and 15. The solder resist SR1 is not provided in formation regions of the electrodes 14 and 15 and has openings OP1 and OP2. An opening OP3 in FIG. 2 illustrates an opening of the solder resist SR2, inside which the solder resist SR1 appears. In the region of the opening OP3, the opening OP1 of the solder resist SR1 is substantially covered by the resin layer 20. Further, the electrode 14 is exposed in the opening OP1 of the solder resist SR1, although not illustrated in FIG. 2. The electrode 15 is exposed in the opening OP2 of the solder resist SR1.

The solder resist SR2 is provided on the solder resist SR1 in the range of the solder resist SR1 not to close the openings OP1 and OP2 of the solder resist SR1 as viewed from above the surface F1. The solder resist SR1 is arranged under the solder resist SR2, so that the solder resists SR1 and SR2 are stacked in two layers.

The solder resist SR2 is provided around the controller chip 30 in plan view as viewed from above the surface F1, and surrounds the controller chip 30. Therefore, the solder resist SR2 is formed in the form of a substantially quadrangular frame having a hole (the opening OP3) at its center. The solder resist SR2 may have a shape of a substantially polygonal frame, a substantially circular ring, or a substantially elliptical ring. That is, the solder resist SR2 has an outer edge E2_out and an inner edge E2_in, and the shape of each of the outer edge E2_out and the inner edge E2_in may be any of a substantially quadrangle, a substantially polygon, a substantially circle, and a substantially elliptical shape. Further, the shapes of the outer edge E2_out and the inner edge E2_in may be similar to each other or may be different from each other. Since the solder resist SR2 is provided on the solder resist SR1, the outer edge E2_out and the inner edge E2_in overlap the solder resist SR1 in the plan view described above.

The outer edge E2_out of the solder resist SR2 is located outside an outer edge E30 of the controller chip 30 and an outer edge E50 of the memory chip 50, and does not overlap the formation region of the electrode 15 (the opening OP2). Therefore, the outer edge E2_out of the solder resist SR2 is located between the opening OP2 of the solder resist SR1 and the outer edge E50 of the memory chip 50.

Further, the inner edge E2_in of the solder resist SR2 is located inside the outer edge E50 of the memory chip 50 and is located outside the outer edge E30 of the controller chip 30. Furthermore, the inner edge E2_in of the solder resist SR2 (an end of the opening OP3) does not overlap the formation region of the electrode 14 (the opening OP1). Therefore, the inner edge E2_in of the solder resist SR2 (the end of the opening OP3) is located between the opening OP1 of the solder resist SR1 or the outer edge E30 of the controller chip 30 and the outer edge E50 of the memory chip 50.

In plan view as viewed from above the surface F1, the controller chip 30 overlaps the formation region of the electrode 14 (the opening OP1) and is located inside the opening OP3, because the controller chip 30 is connected to the electrode 14 in flip-chip connection. That is, the outer edge E30 of the controller chip 30 is located inside the opening OP3 in the plan view described above. The outer edge E30 of the controller chip 30 may be located inside or outside the opening OP1. That is, the controller chip 30 may be smaller than the opening OP1 of the solder resist SR1 and be located inside the opening OP1, or may be larger than the opening OP1.

The memory chip 50 is larger than the controller chip 30, and the outer edge E50 of the memory chip 50 is located outside the outer edge E30 of the controller chip 30 in the plan view described above. Further, the outer edge E50 of the memory chip 50 does not reach the opening OP2 so as to allow the pad 51 of the memory chip 50 and the electrode 15 to be connected to each other with the metal wire 70. Therefore, the outer edge E50 of the memory chip 50 is located between the formation region of the electrode 15 (the opening OP2) and the controller chip 30. As viewed from above the surface F1, the memory chip 50 overlaps the controller chip 30, the opening OP1, and the solder resist SR2 and is located inside the outer edge E2_out of the solder resist SR2.

As the memory chip 50 in FIG. 2, the outer edge E50 of the lowermost memory chip 50 is illustrated. The resin layer 40 in FIG. 1 that directly covers the controller chip 30 and the solder resist SR2 has substantially the same size as the memory chip 50, if bleeding or regressing does not occur. Therefore, the outer edge E50 of the memory chip 50 is substantially coincident with an outer edge of the resin layer 40 and overlaps it as viewed from above the surface F1. In this case, the outer edge E2_out of the solder resist SR2 is located outside the outer edge of the resin layer 40 as viewed from above the surface F1.

The resin layer (NCP) 20 covers and protects the electrode 14 between the controller chip 30 and the circuit board 10. An outer edge E20 of the resin layer 20 overlaps either of the solder resists SR1 and SR2 as viewed from above the surface F1.

As illustrated in FIG. 1, the resin layer (DAF) 40 is pasted to the back of the memory chip 50, and covers the entirety of the controller chip 30 and the resin layer 20 when the memory chip 50 is stacked on the controller chip 30.

Here, the solder resists SR1 and SR2 are stacked and are formed to be selectively thick around the controller chip 30, as illustrated in FIG. 1. Therefore, when the memory chip 50 is stacked, the solder resists SR1 and SR2 are substantially thick under the resin layer 40. Accordingly, a thickness T40 of the resin layer 40 between the memory chip 50 and the solder resist SR2 is relatively thin.

In a case where the solder resist SR2 is not provided, the resin layer 40 between the memory chip 50 and the solder resist SR1 becomes thick. In this case, it is necessary to make the resin layer 40 to be pasted to the memory chip 50 in advance thick and, when the memory chip 50 is pasted onto the controller chip 30, it is highly likely that the resin layer 40 bleeds or regresses from the outer edge E50 of the memory chip 50. When the resin layer 40 reaches the electrode 15 because of bleeding of the resin layer 40, wire bonding to the electrode 15 may not be able to be performed. Further, the memory chip 50 can be easily tilted with respect to the surface F1 of the circuit board 10 or the top surface of the controller chip 30. This tilt causes the memory chip 50 to be warped or cracked, thereby decreasing the reliability of the semiconductor device 1.

Figure 3:
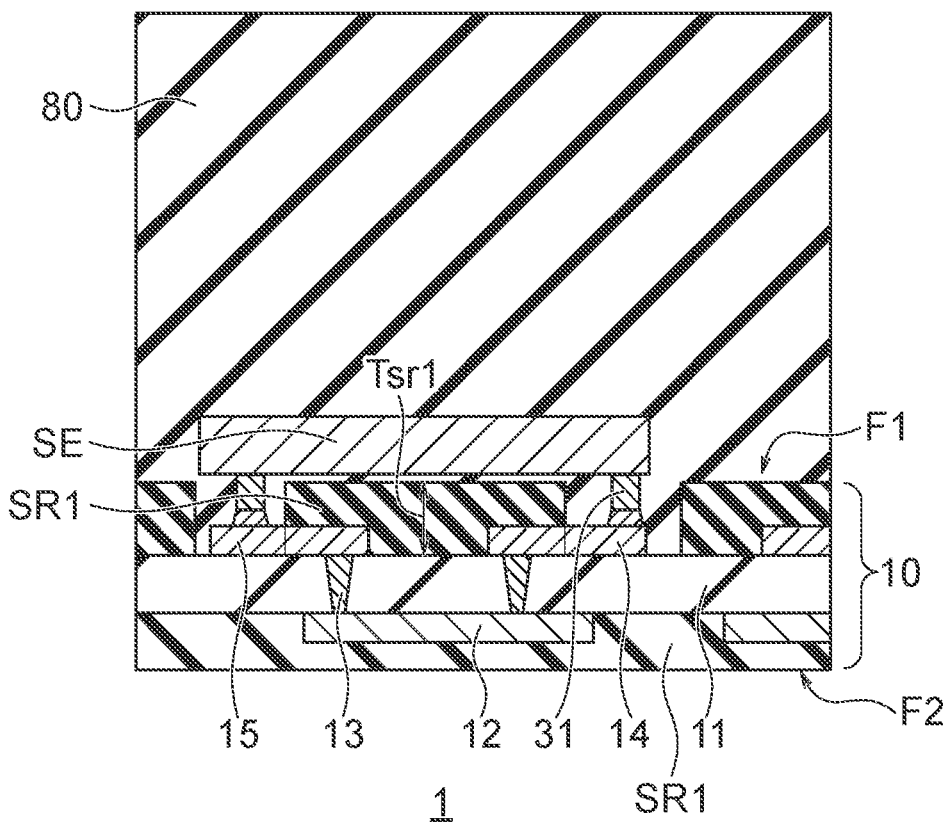
FIG. 3 is a cross-sectional view illustrating a configuration example of the semiconductor element mounted on the circuit board.

Further, when the solder resist SR1 is simply made thick in order to make the resin layer 40 thin, a solder resist on the surface F1 of the circuit board 10 other than the openings OP1 and OP2 becomes thick as a whole. In this case, the solder resist SR1 at the outer edge of the opening OP2 becomes thick, and the metal wire 70 may come into contact with the solder resist SR1. Further, when the entire solder resist SR1 is made thick, a thickness Tsr1 of the solder resist SR1 under another semiconductor element (a resistor, a capacitor, or the like) SE other than the controller chip 30 and the memory chip 50 is also increased, as illustrated in FIG. 3. FIG. 3 is a cross-sectional view illustrating a configuration example of the semiconductor element SE mounted on the circuit board 10. The semiconductor element SE is mounted on the same circuit board 10 as the controller chip 30 and the memory chip 50 together with these chips. In this case, in mounting of the semiconductor element SE on the circuit board 10, the solder resist SR1 interferes with the connection of the semiconductor element SE and makes it difficult to connect the semiconductor element SE to the circuit board 10.

Furthermore, the balance of stress applied to the circuit board 10 is lost due to the difference of thickness between the solder resist SR1 on the surface F1 of the circuit board 10 and a solder resist (not illustrated) on the back F2, so that the circuit board 10 may be warped.

Meanwhile, in the semiconductor device 1 according to the present embodiment, the solder resist SR2 is stacked on the solder resist SR1 separately from the solder resist SR1. Therefore, the solder resist SR2 is selectively provided around the controller chip 30 to which the memory chip 50 is pasted, but is not provided on the solder resist SR1 other than the region around the controller chip 30. That is, the solder resist SR2 is provided only in a region where the resin layer 40 is provided.

Accordingly, the thickness of the resin layer 40 can be reduced by the thickness of the solder resist SR2. Due to this thickness reduction of the resin layer 40, the resin layer 40 is hard to bleed or regress from the outer edge E50 of the memory chip 50 when the memory chip 50 is pasted onto the controller chip 30. Therefore, wire bonding to the electrode 15 is not hindered. Further, the memory chip 50 is hard to be tilted with respect to the surface F1 of the circuit board 10 or the top surface of the controller chip 30 and becomes substantially flat, leading to improvement of the reliability of the semiconductor device 1. Furthermore, embeddability of the resin layer 40 is improved, so that it is possible to prevent voids from remaining between the resin layer 40 and the solder resist SR2, the resin layer 20, and the controller chip 30.

Further, the solder resist SR2 is in the range of the solder resist SR1 and has the step ST in FIG. 1 in the opening OP2. Therefore, the solder resists SR1 and SR2 become thicker in a stepwise manner at the outer edge of the opening OP2, so that it is possible to prevent the metal wire 70 from interfering with the solder resists SR1 and SR2.

Furthermore, the solder resist SR2 is provided around the controller chip 30, but is not provided on the solder resist SR1 other than the region around the controller chip 30. Further, the thickness (Tsr1 in FIG. 3) of the solder resist SR1 itself is not so large. Therefore, when another semiconductor element SE is mounted on the circuit board 10, it is possible to prevent the semiconductor element SE from interfering with the solder resist SR1.

Further, it suffices that the solder resist SR2 is provided on the surface F1 of the circuit board 10 in a bare minimum range. Therefore, the thickness of the solder resist SR1 on the surface F1 and the thickness of a solder resist on the back F2 are not so different from each other, so that warpage of the circuit board 10 can be prevented.

Next, a manufacturing method of the semiconductor device 1 according to the present embodiment is described.

FIGS. 4 to 7 are cross-sectional views illustrating an example of the manufacturing method of the semiconductor device 1 according to the first embodiment.

Figure 4:
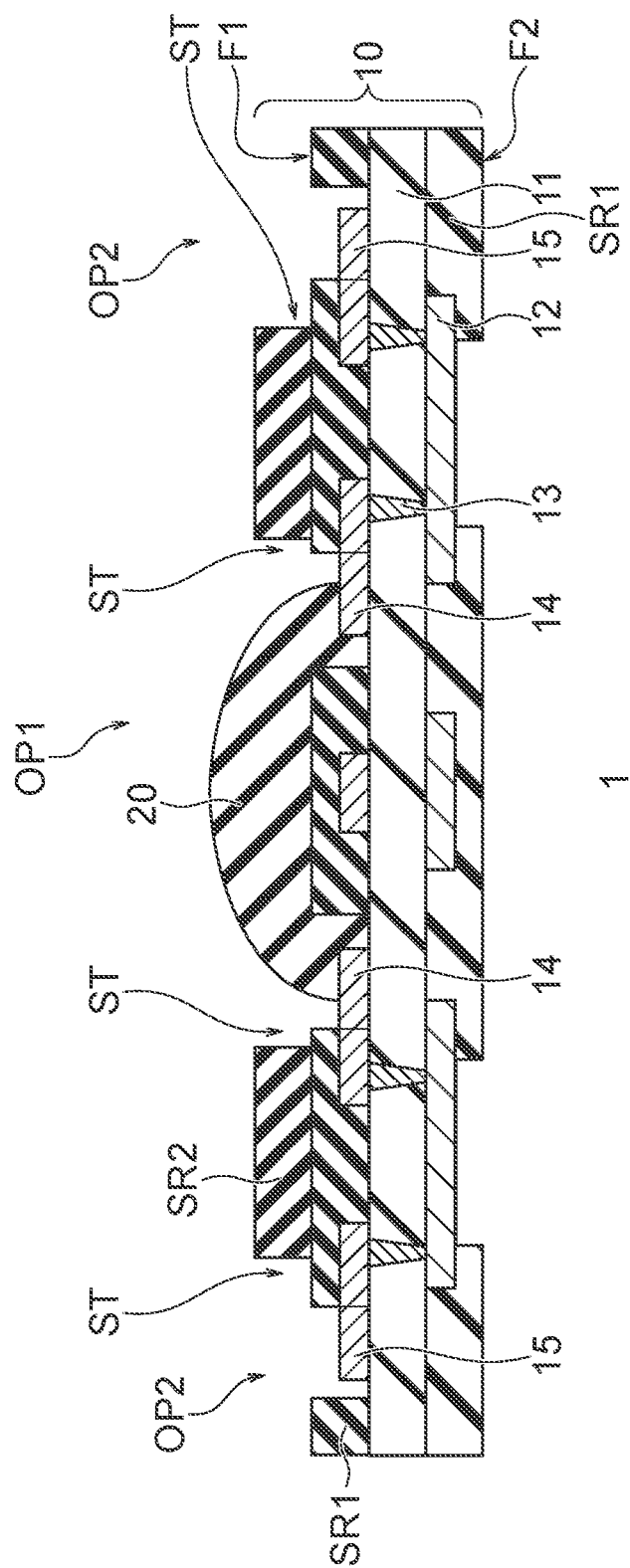
FIGS. 4 to 7 are cross-sectional views illustrating an example of the manufacturing method of the semiconductor device according to the first embodiment.

First, the material (NCP) for the resin layer 20 is supplied to a mounting position of the controller chip 30 on the circuit board 10, as illustrated in FIG. 4. The circuit board 10 includes the insulating substrate 11, the wire 12, the electrodes 14 and 15, and the solder resists SR1 and SR2. The wire 12 is provided on a surface of the insulating substrate 11 and in the insulating substrate 11. The electrodes 14 and 15 are exposed from the insulating substrate 11 and the solder resists SR1 and SR2 on the surface F1.

The solder resist SR1 is provided around the electrodes 14 and 15 and has the openings OP1 and OP2 in formation regions of the electrodes 14 and 15. The solder resist SR2 is provided on the solder resist SR1 in a range of the solder resist SR1. The solder resist SR2 is provided around the mounting position of the controller chip 30 to surround that position. Therefore, the solder resists SR1 and SR2 have the step ST at ends of the openings OP1 and OP2. That is, inner edges and outer edges of the solder resists SR1 and SR2 have the step ST. Accordingly, the paste-like material for the resin layer 20 is hard to protrude from the opening OP1. Further, the metal wire 70 to be bonded to the electrode 15 is hard to interfere with the solder resists SR1 and SR2.

The material (NCP) for the resin layer 20 is a paste-like non-conductive resin material. The resin layer 20 is filled between the controller chip 30 and the circuit board 10 to connect these elements to each other, when the controller chip 30 is connected to the circuit board 10 in flip-chip connection. The material for the resin layer 20 is not limited to the NCP, and may be a NCF (Non-Conductive Film) or a CUF (Capillary Under Fill) material.

Figure 5:
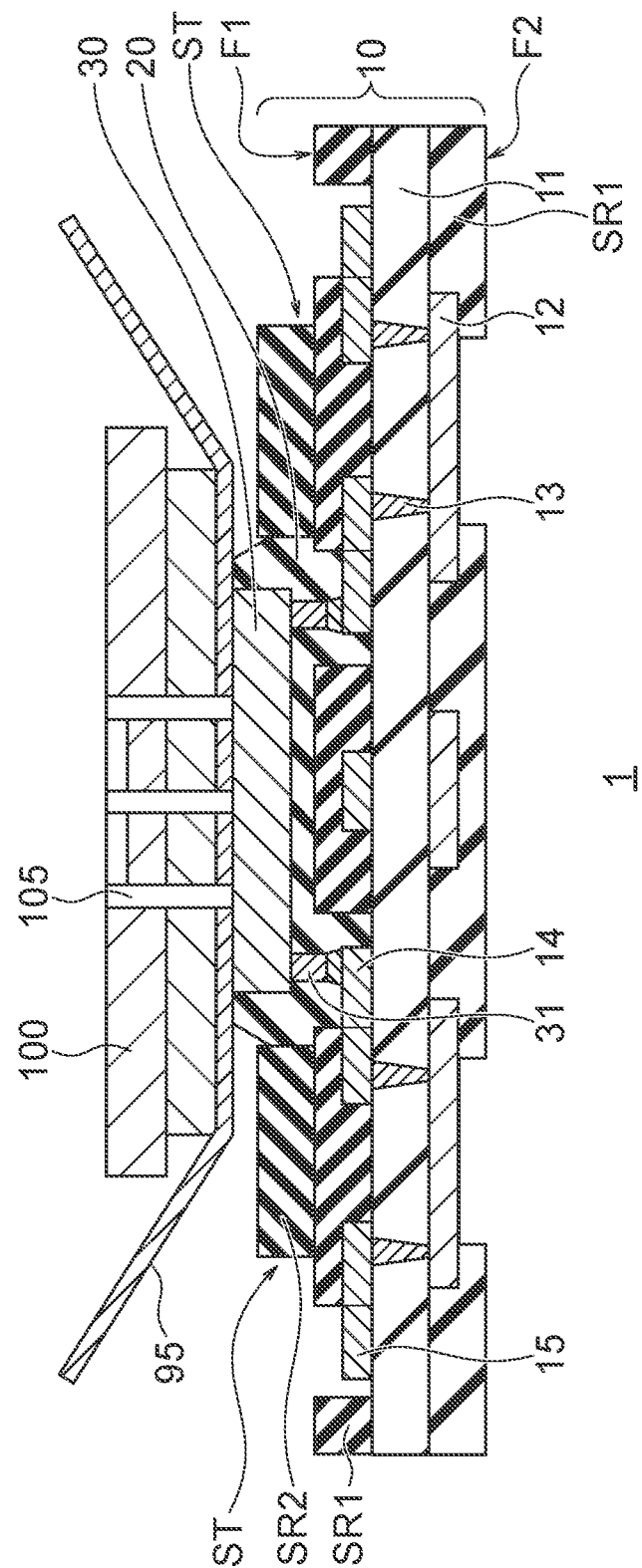

Next, as illustrated in FIG. 5, a crimping device 100 sucks the controller chip 30 via an FAB (Film Assist Bonding) film 95 and arranges the controller chip 30 on the circuit board 10. At this time, the crimping device 100 stacks the controller chip 30 on the circuit board 10 in such a manner that the metal bump 31 of the controller chip 30 corresponds to the electrode 14 on the circuit board 10.

The crimping device 100 has a suction hole 105 connected to a vacuum pump (not illustrated) and sucks the controller chip 30 through the suction hole 105. A suction surface of the crimping device 100 crimps the controller chip 30 onto the circuit board 10 and makes the top surface of the resin layer 20 substantially flat. The FAB film 95 as a resin film is interposed between the crimping device 100 and the controller chip 30 in order to prevent the material for the resin layer 20 from adhering to the crimping device 100.

After stacking the controller chip 30 on the circuit board 10, the crimping device 100 heats the circuit board 10 and the controller chip 30 while applying a pressure to these elements. Accordingly, the metal bump 31 of the controller chip 30 is connected (welded) to the electrode 14 on the circuit board 10. When the controller chip 30 is stacked on the circuit board 10, the material for the resin layer 20 is filled between the controller chip 30 and the circuit board 10. The material for the resin layer 20 may be lifted on the side surface of the controller chip 30 to some extent.

Figure 6:
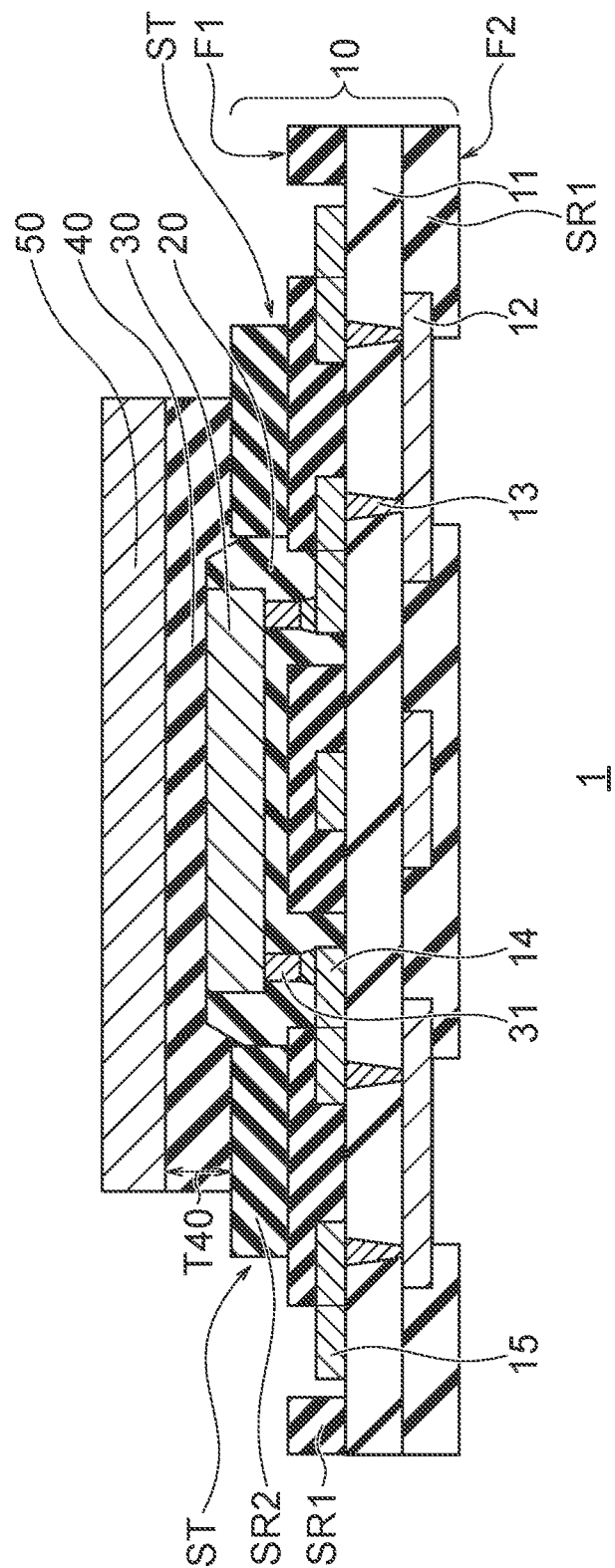
Figure 7:
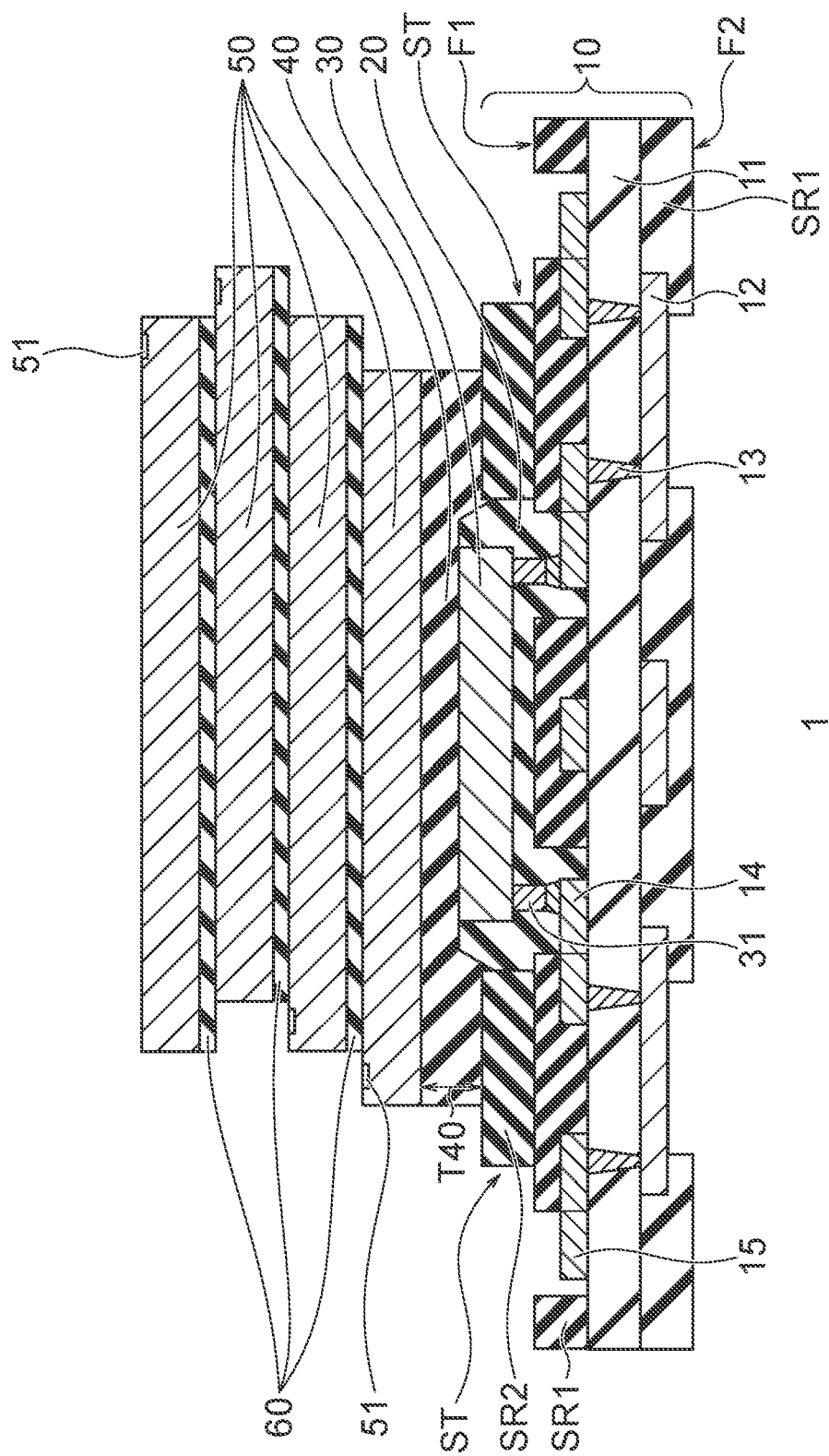

Next, as illustrated in FIG. 6, the memory chip 50 with the resin layer 40 pasted to the back thereof is pasted onto the controller chip 30 and the solder resist SR2. At this time, the memory chip 50 is pressed against the controller chip 30 while being heated, and the controller chip 30 and the resin layer 20 are covered by the resin layer 40. Further, the resin layer 40 is heated and pressurized to eliminate voids, and is hardened. The memory chip 50 is bonded above the controller chip 30 via the resin layer 40 in this manner.

This configuration in plan view as viewed from the above the surface F1 has been described referring to FIG. 2. In this plan view, the memory chip 50 and the resin layer 40 are larger than the controller chip 30 and are smaller than the solder resist SR2. Further, the solder resist SR2 is arranged around the controller chip 30 to surround the controller chip. Therefore, the resin layer 40 is bonded onto the solder resist SR2, while covering the controller chip 30. Accordingly, even if the resin layer 40 is relatively thin, the resin layer 40 can sufficiently bury and cover the memory chip 50 and the resin layer 20.

Next, another memory chip 50 is further stacked on the memory chip 50. At this time, the adhesive layer 60 is provided between the memory chips 50, so that the memory chips 50 are bonded to each other with the adhesive layer 60.

Thereafter, another semiconductor element is connected onto the circuit board 10. Bonding between the pad 51 and the electrode 15 is achieved by means of the metal wire 70. Further, the memory chip 50 and the metal wire 70 are sealed with the sealing resin 80. The metal bump 90 is formed on the wire (or the pad) 12 on the second surface F2. Consequently, a package of the semiconductor device 1 illustrated in FIG. 1 is completed.

According to the present embodiment, the thickness of the controller chip 30 and the resin layer 20 that are buried by the resin layer 40 is reduced by forming the solder resists SR1 and SR2 in two layers. Therefore, the resin layer 40 can sufficiently bury the memory chip 50 and the resin layer 20, while bleeding and regressing of the resin layer 40 are prevented. Further, the thickness of the resin layer 40 can be reduced by stacking the solder resist SR2 on the solder resist SR1. Accordingly, the memory chip 50 can be arranged substantially in parallel to the controller chip 30 or the surface F1 of the circuit board 10.

Further, the solder resist SR2 is in the range of the solder resist SR1 and has the step ST in the opening OP2. Therefore, the solder resists SR1 and SR2 become thicker in a stepwise manner at the outer edge of the opening OP2, so that it is possible to prevent the metal wire 70 from interfering with the solder resists SR1 and SR2.

The solder resist SR2 is provided around the controller chip 30, but is not provided on the solder resist SR1 other than the region around the controller chip 30. Therefore, when another semiconductor element SE is mounted on the circuit board 10, it is possible to prevent interference of the solder resist SR1 with the other semiconductor element SE.

The solder resist SR2 is provided on the surface F1 of the circuit board 10 in a bare minimum range. Therefore, the thickness of the solder resist SR1 on the surface F1 and the thickness of a solder resist on the back F2 are not so different from each other, so that warpage of the circuit board 10 can be prevented.

Second Embodiment

Figure 8:
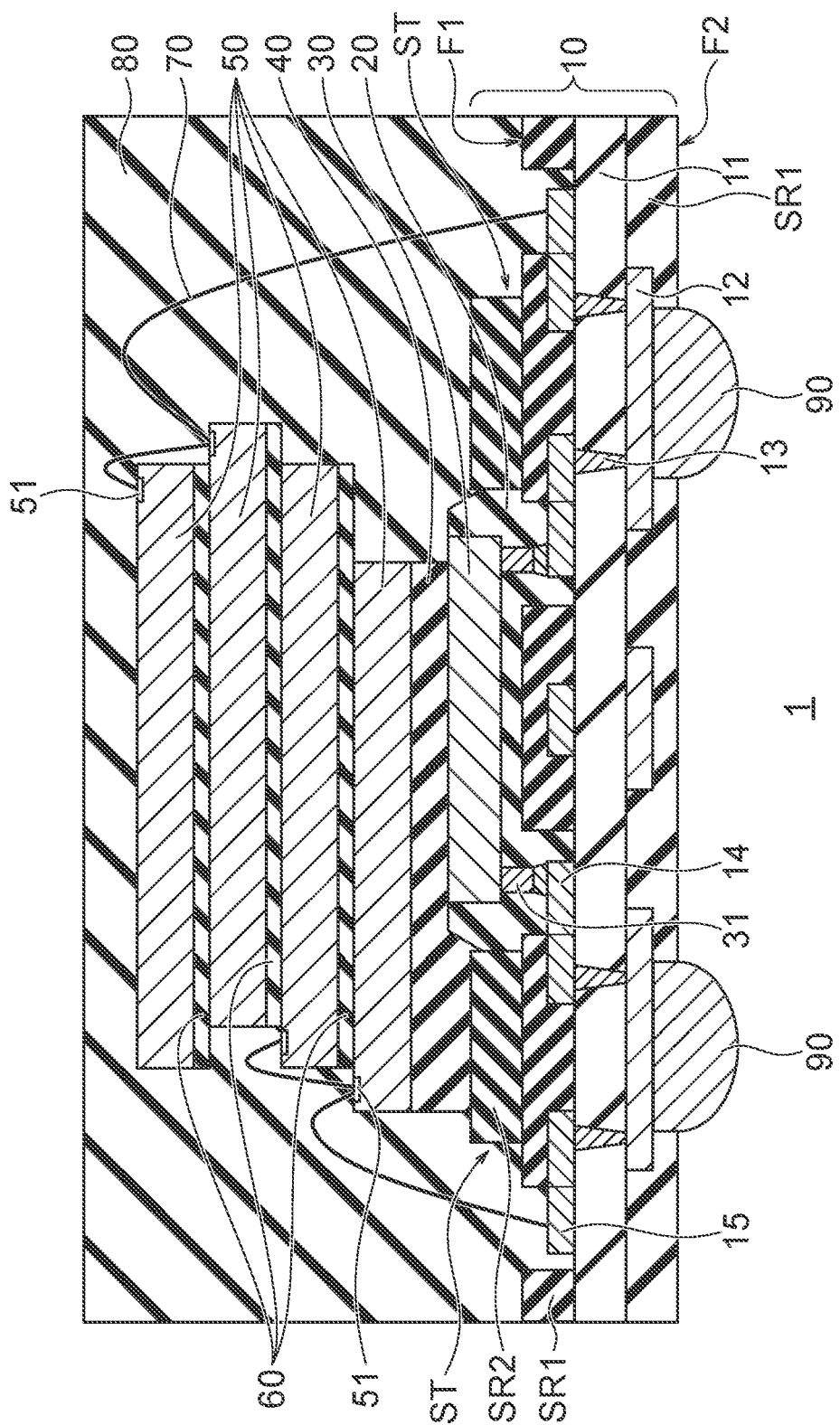
FIG. 8 is a cross-sectional view illustrating a configuration example of the semiconductor device 1 according to a second embodiment.

FIG. 8 is a cross-sectional view illustrating a configuration example of the semiconductor device 1 according to a second embodiment. In the second embodiment, the memory chip 50 and the resin layer 40 are shifted to one side of the controller chip 30. With this shift, the resin layer 20 and the controller chip 30 are partially exposed from the resin layer 40. As described above, the memory chip 50 and the resin layer 40 may be shifted to one side of the controller chip 30 in plan view as viewed from above the surface F1. Other configurations of the second embodiment may be identical to corresponding ones of the first embodiment. Therefore, the second embodiment can achieve effects identical to those of the first embodiment.

Third Embodiment

Figure 9:
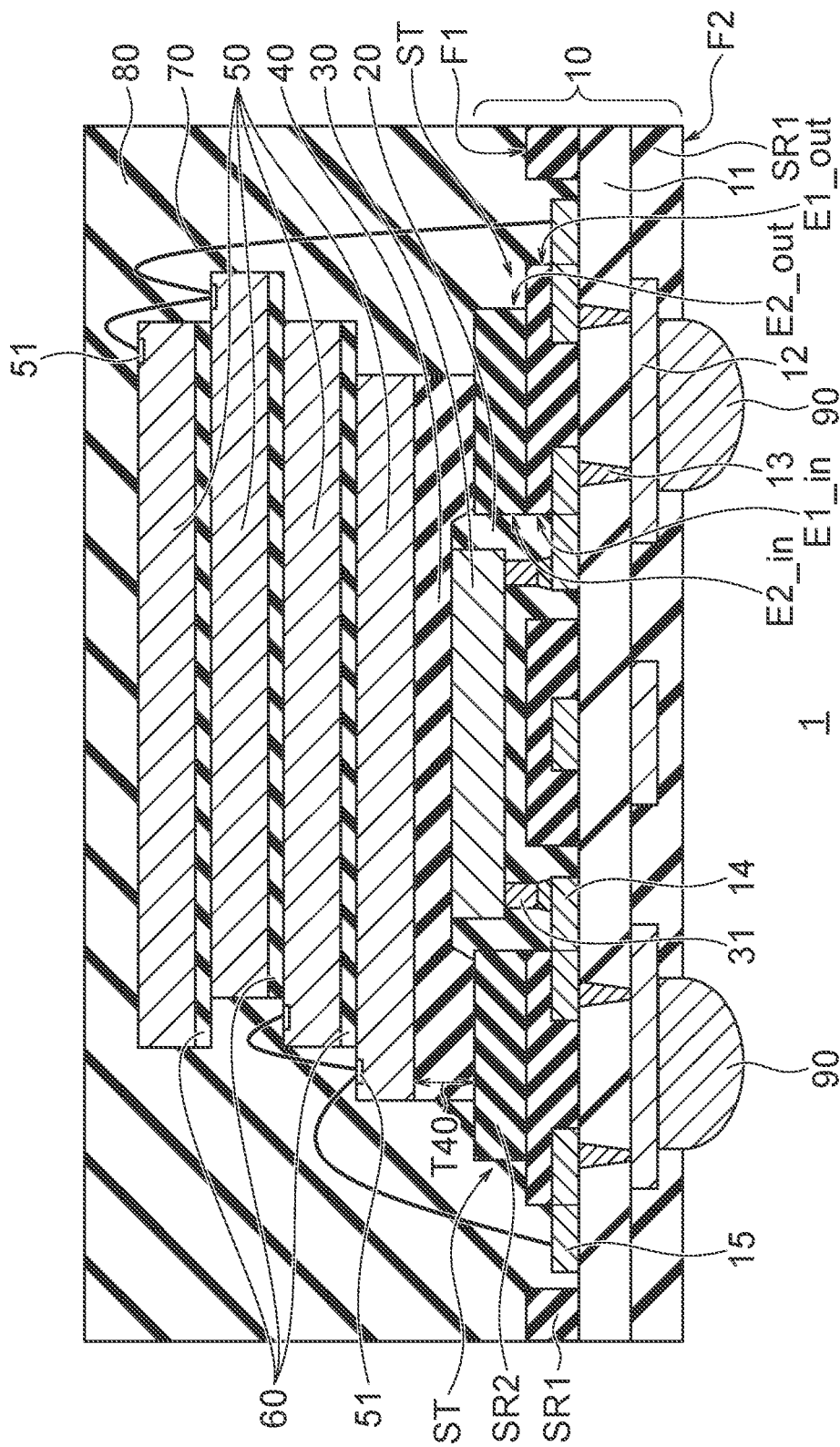
FIG. 9 is a cross-sectional view illustrating a configuration example of the semiconductor device according to a third embodiment.

FIG. 9 is a cross-sectional view illustrating a configuration example of the semiconductor device 1 according to a third embodiment. In the third embodiment, the inner edge E2_in of the solder resist SR2 is located at substantially the same position as an inner edge E1_in of the solder resist SR1 and those inner edges overlap each other, in plan view as viewed from above the surface F1. Other configurations of the third embodiment may be identical to corresponding ones of the first embodiment. Therefore, the third embodiment can achieve effects identical to those of the first embodiment.

Fourth Embodiment

Figure 10:
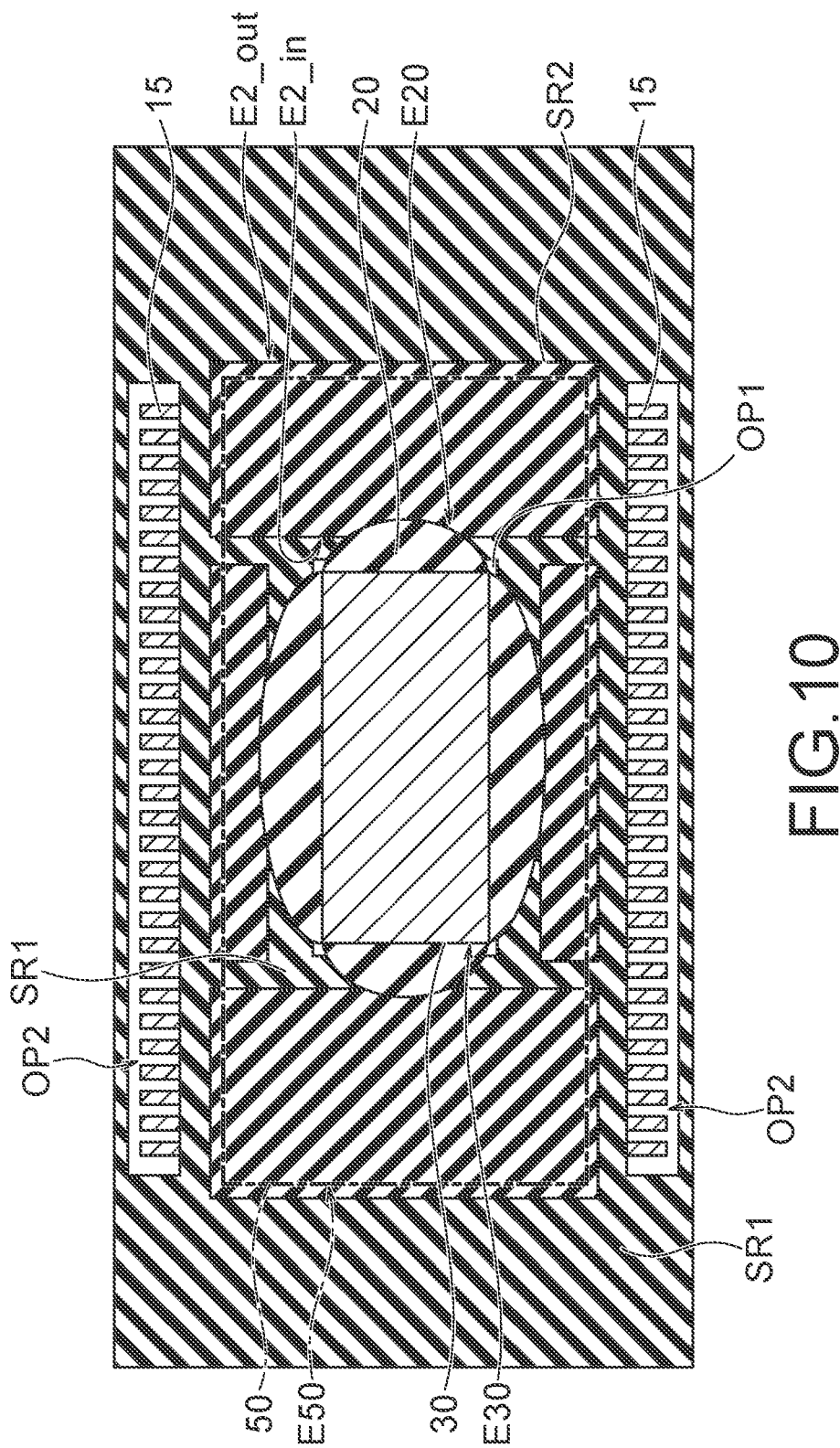
FIG. 10 is a plan view illustrating a configuration example of the semiconductor device according to a fourth embodiment.

FIG. 10 is a plan view illustrating a configuration example of the semiconductor device 1 according to a fourth embodiment. In the fourth embodiment, the solder resist SR2 is divided into a plurality of portions in plan view as viewed from above the surface F1. Each portion of the solder resist SR2 is substantially quadrangular. The solder resist SR2 according to the present embodiment can be more easily processed and arranged than the solder resist SR2 in the form of a frame. Meanwhile, the resin layer 40 may bleed from a gap between the portions of the solder resist SR2. However, bleeding of the resin layer 40 can be prevented by arranging the portions of the solder resist SR2 to make the gap sufficiently narrow. Other configurations of the fourth embodiment may be identical to corresponding ones of the first embodiment. Therefore, the fourth embodiment can achieve effects identical to those of the first embodiment.

Fifth Embodiment

Figure 11:
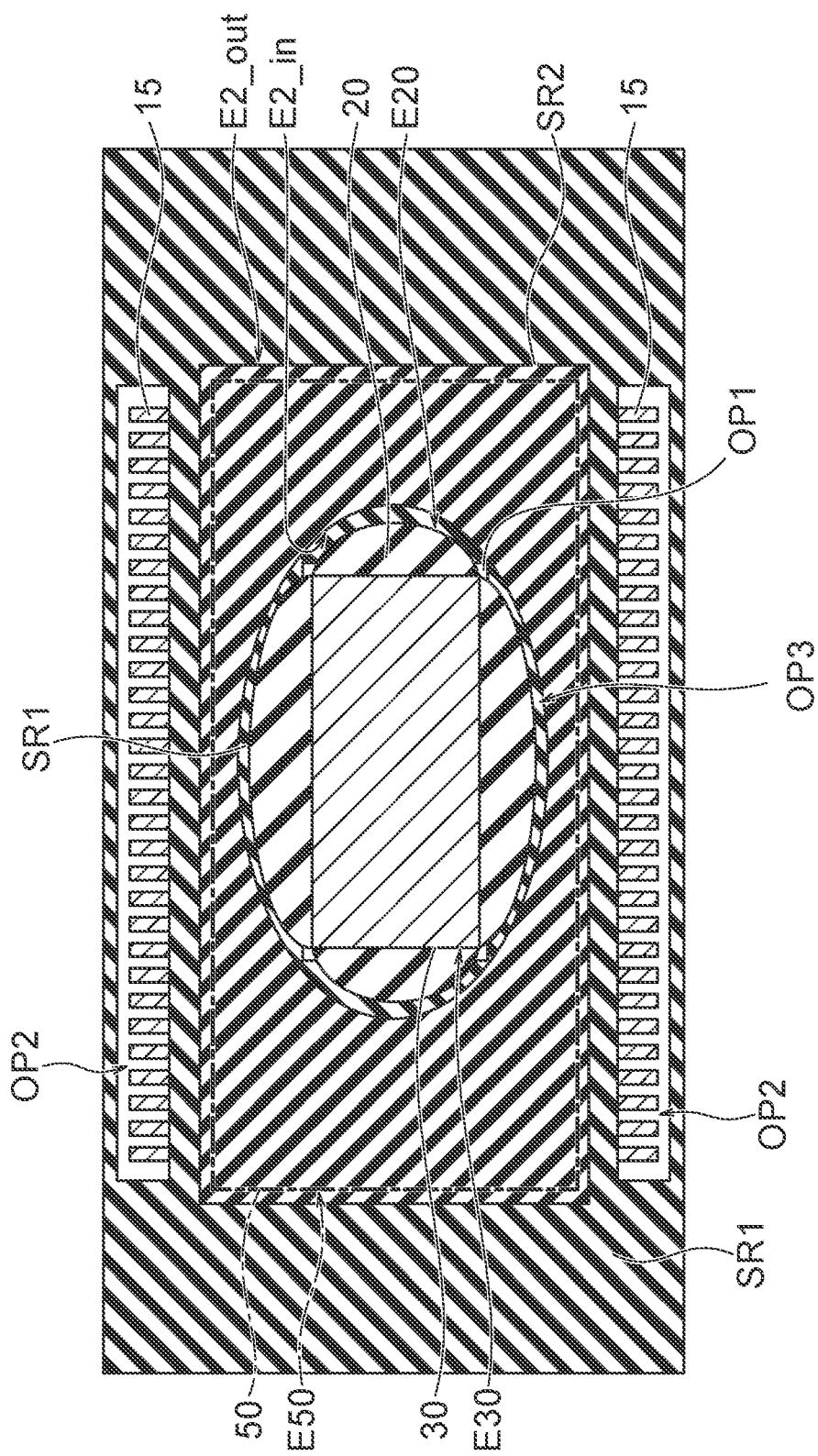
FIG. 11 is a plan view illustrating a configuration example of the semiconductor device according to a fifth embodiment.

FIG. 11 is a plan view illustrating a configuration example of the semiconductor device 1 according to a fifth embodiment. In the fifth embodiment, the inner edge E2_in of the solder resist SR2 is processed to match with the shape of the resin layer 20 that bleeds from the outer edge E30 of the controller chip 30 in plan view as viewed from above the surface F1. For example, in a case where bleeding of the resin layer 20 occurs around the outer edge E30 of the controller chip 30 substantially circularly or substantially elliptically, the inner edge E2_in of the solder resist SR2 is processed along the resin layer 20 to be substantially circular or substantially elliptical. Accordingly, the resin layer 20 can easily stay inside the solder resist SR2, so that it is possible to prevent the resin layer 20 from excessively protruding on the solder resist SR2. Other configurations of the fifth embodiment may be identical to corresponding ones of the first embodiment. Therefore, the fifth embodiment can achieve effects identical to those of the first embodiment.

Sixth Embodiment

Figure 12:
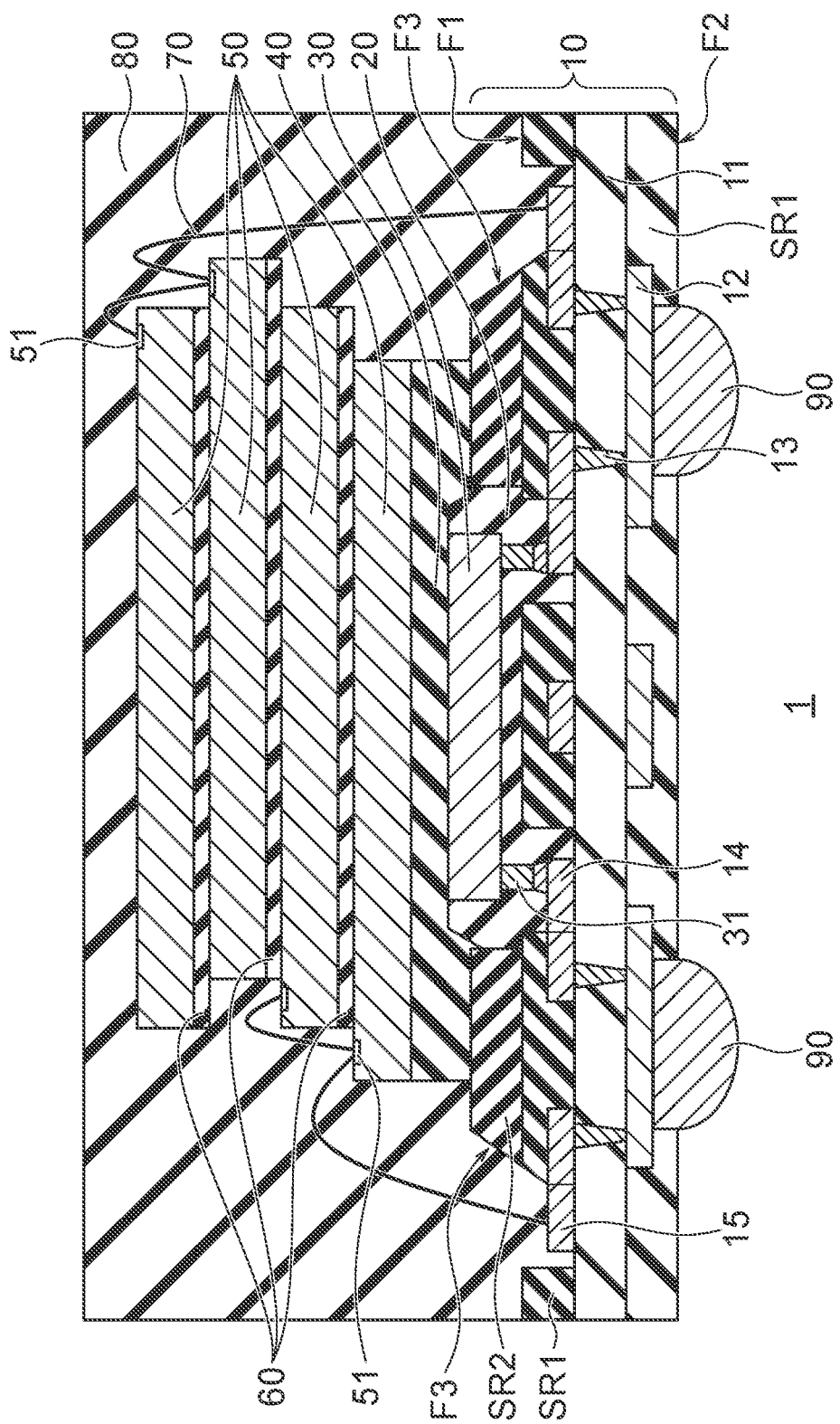
FIG. 12 is a cross-sectional view illustrating a configuration example of the semiconductor device according to a sixth embodiment.

FIG. 12 is a cross-sectional view illustrating a configuration example of the semiconductor device 1 according to a sixth embodiment. In the sixth embodiment, outer side surfaces F3 of the solder resists SR1 and SR2 are tilted. For example, the outer side surfaces F3 of the solder resists SR1 and SR2 are tilted from a substantially perpendicular direction with respect to the surface F1 in such a manner that the solder resists SR1 and SR2 become wider from the top surface of the solder resist SR2 to the bottom surface of the solder resist SR1 (in such a manner that the solder resists SR1 and SR2 have a hem). Inner wall surfaces of the solder resists SR1 and SR2 may be also tilted.

With this configuration, the solder resists SR1 and SR2 are more likely to interfere with the metal wire 70. Other configurations of the sixth embodiment may be identical to corresponding ones of the first embodiment. Therefore, the sixth embodiment can achieve effects identical to those of the first embodiment.

Seventh Embodiment

Figure 13:
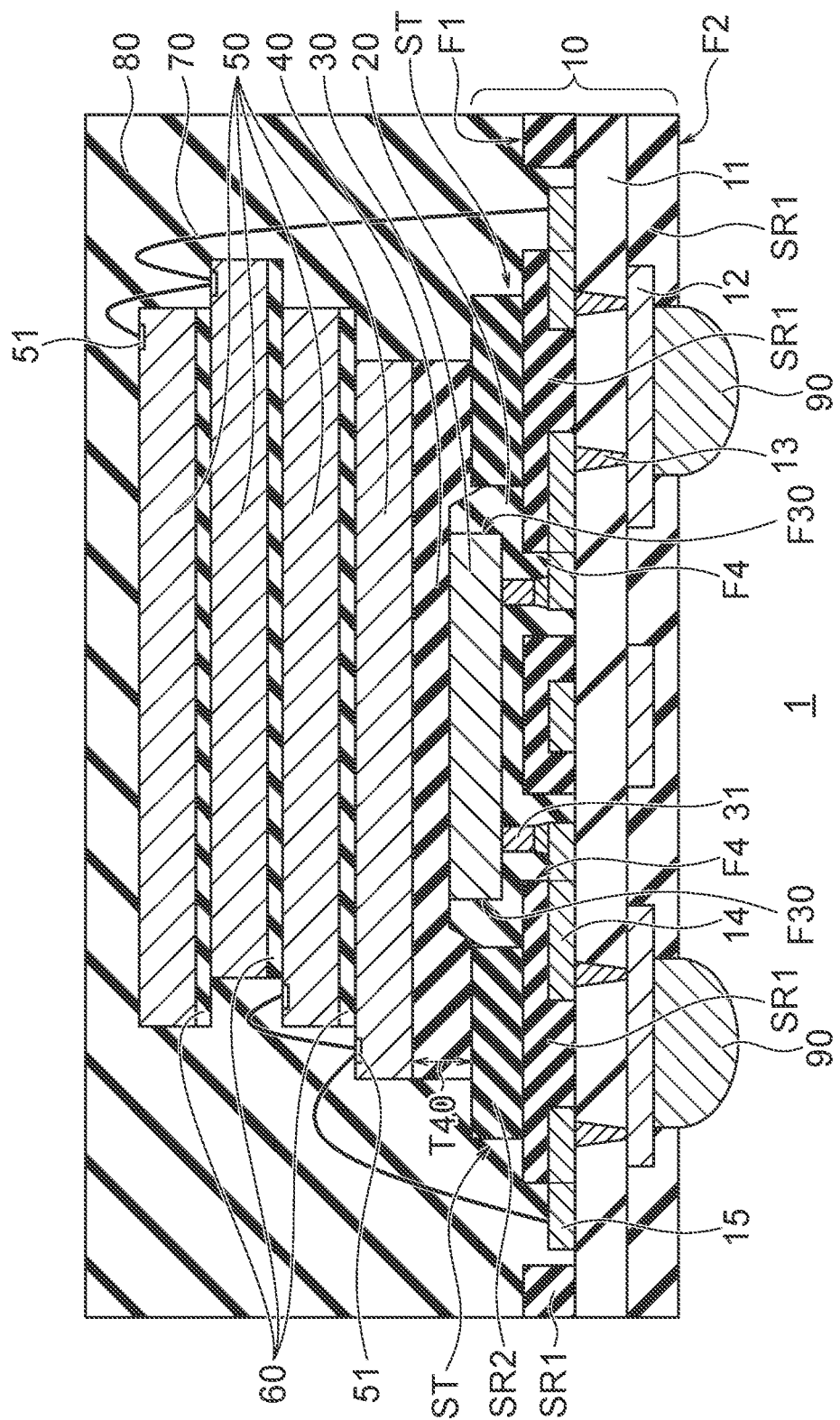
FIG. 13 is a cross-sectional view illustrating a configuration example of the semiconductor device according to a seventh embodiment.

FIG. 13 is a cross-sectional view illustrating a configuration example of the semiconductor device 1 according to a seventh embodiment. In the seventh embodiment, an inner end of the solder resist SR1 is located under the controller chip 30. In plan view as viewed from above the surface F1, an inner side surface (an inner edge) F4 of the solder resist SR1 is closer to the center of the controller chip 30 relative to a side surface (an outer edge) F30 of the controller chip 30. That is, in the plan view described above, the entire inner circumference of the solder resist SR1 is located on the inner side of the entire outer circumference of the lowermost controller chip 30, and the inner edge of the solder resist SR1 is overlapped by the controller chip 30.

With this configuration, a distance between the solder resist SR1 and the controller chip 30 becomes narrow. Therefore, the resin layer 20 is compressed between the solder resist SR1 and the controller chip 30 when the controller chip 30 is bonded onto the circuit board 10, as illustrated in FIG. 5. Accordingly, it is possible to prevent generation of voids in the resin layer 20.

Other configurations of the seventh embodiment may be identical to corresponding ones of the first embodiment. Therefore, the seventh embodiment can achieve effects identical to those of the first embodiment.

Eighth Embodiment

Figure 14:
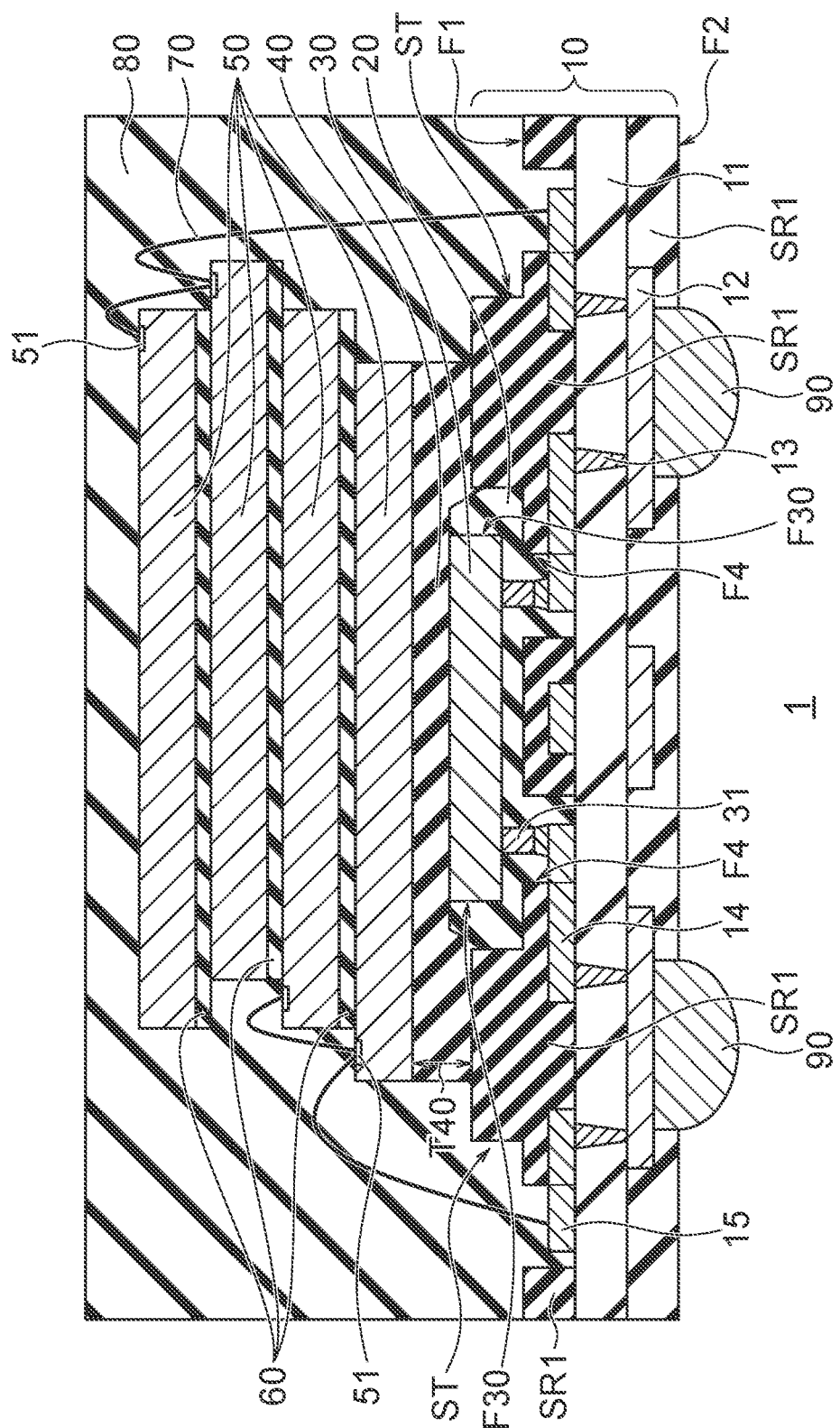
FIG. 14 is a cross-sectional view illustrating a configuration example of the semiconductor device according to an eighth embodiment.

FIG. 14 is a cross-sectional view illustrating a configuration example of the semiconductor device 1 according to an eighth embodiment. In the eighth embodiment, the solder resists SR1 and SR2 are integrally molded together. For example, the solder resist SR1 is formed to be thick, and the solder resist SR2 is omitted. The solder resist SR1 is processed to have a stepped portion by lithography and etching in such a manner that the inner side surface F4 of the solder resist SR1 is located under the controller chip 30. Accordingly, while omitting the solder resist SR2, the same configuration as that of the seventh embodiment is obtained. With this configuration, the eighth embodiment can achieve effects identical to those of the seventh embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a circuit board comprising a plurality of electrodes provided on a first surface, a first resin layer provided on the first surface around the electrodes, and a second resin layer provided on the first resin layer;
    a first semiconductor chip electrically connected to a first electrode of the electrodes having a top surface higher than a top of the second resin layer;
    a second semiconductor chip provided above the first semiconductor chip, being larger than the first semiconductor chip, and connected to a second electrode of the electrodes via a metal wire; and
    a third resin layer provided between the first semiconductor chip and the second semiconductor chip and between the second resin layer and the second semiconductor chip, contacting the top surface of the first semiconductor chip and the top surface of the second resin layer, and covering the first semiconductor chip, the second resin layer extending beyond the third resin layer, wherein
    the first semiconductor chip includes a bottom surface opposing the first surface and is electrically connected to the first electrode via a third electrode provided on the bottom surface.

2. The device of claim 1, wherein the second resin layer surrounds the first semiconductor chip as viewed from above the first surface.

3. The device of claim 1, wherein an outer edge of the second resin layer is located between the first semiconductor chip and the second electrode as viewed from above the first surface.

4. The device of claim 1, wherein an outer edge of the second resin layer is located outside an outer edge of the second semiconductor chip and overlaps the first resin layer as viewed from above the first surface.

5. The device of claim 1, wherein an outer edge of the second resin layer is located outside an outer edge of the third resin layer and overlaps the first resin layer as viewed from above the first surface.

6. The device of claim 1, wherein an inner edge of the second resin layer is located outside an outer edge of the first semiconductor chip and overlaps the first resin layer as viewed from above the first surface.

7. The device of claim 1, wherein an inner edge of the first resin layer substantially overlaps an inner edge of the second resin layer as viewed from above the first surface.

8. The device of claim 1, wherein an outer edge of the second semiconductor chip is located outside an outer edge of the first semiconductor chip and is located between the second electrode and the first semiconductor chip as viewed from above the first surface.

9. The device of claim 1, wherein an outer edge of the second semiconductor chip substantially overlaps an outer edge of the third resin layer as viewed from above the first surface.

10. The device of claim 1, further comprising a fourth resin layer provided between the circuit board and the first semiconductor chip,
    wherein the third resin layer covers the first semiconductor chip and the fourth resin layer.

11. The device of claim 10, wherein an outer edge of the fourth resin layer overlaps either the first resin layer or the second resin layer as viewed from above the first surface.

12. The device of claim 1, wherein outer edges of the first and second resin layers have a step.

13. The device of claim 1, wherein inner edges of the first and second resin layers have a step.

14. The device of claim 1, Therein an inner edge of the first resin layer is closer to a center of the first semiconductor chip relative to an outer edge of the first semiconductor chip as viewed from above the first surface.

15. The device of claim 14, wherein the first and second resin layers are formed integrally as viewed from above the first surface.

16. The device of claim 1, wherein a height of an upper surface of the second resin layer from the first surface is lower than a height of an upper surface of the first semiconductor chip from the first surface.

17. The device of claim 10, wherein the fourth resin layer directly contacts with the third electrode.

18. The device of claim 10, wherein the fourth resin layer is provided on an upper surface of the second resin layer.

19. The device of claim 10, wherein the fourth resin layer has a substantial circular shape, or a substantial elliptical shape as viewed from above the first surface.

20. The device of claim 1, wherein the first resin layer is provided on a first side of the second electrode above the first surface, the first side is opposite to a second side of the second electrode above the first surface, and the first semiconductor chip is provided on the second side of the second electrode above the first surface.

* * * * *